United States Patent
Xu et al.

(10) Patent No.: US 10,928,852 B2
(45) Date of Patent: Feb. 23, 2021

(54) MOUNTING STRUCTURE FOR REAR HOUSING OF DISPLAY DEVICE AND DISPLAY DEVICE

(71) Applicants: Beijing BOE Technology Development Co., Ltd., Beijing (CN); BOE TECHNOLOGY GROUP CO., LTD., Beijing (CN)

(72) Inventors: Jian Xu, Beijing (CN); Jianbo Xian, Beijing (CN); Yong Qiao, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/630,385

(22) PCT Filed: May 17, 2019

(86) PCT No.: PCT/CN2019/087436
§ 371 (c)(1),
(2) Date: Jan. 10, 2020

(87) PCT Pub. No.: WO2019/223620
PCT Pub. Date: Nov. 28, 2019

(65) Prior Publication Data
US 2020/0183447 A1 Jun. 11, 2020

(30) Foreign Application Priority Data
May 25, 2018 (CN) .......................... 201820792037.6

(51) Int. Cl.
*G06F 1/16* (2006.01)
*F16M 11/04* (2006.01)

(52) U.S. Cl.
CPC ......... *G06F 1/1607* (2013.01); *F16M 11/041* (2013.01); *F16M 2200/028* (2013.01)

(58) Field of Classification Search
None
See application file for complete search history.

(56) References Cited

U.S. PATENT DOCUMENTS 5,947,440 A * 9/1999 Cho ...................... F16M 11/10
361/679.22
5,978,211 A * 11/1999 Hong ..................... F16M 11/10
361/679.23
(Continued)

FOREIGN PATENT DOCUMENTS

| CN | 202095024 U | 12/2011 |
| CN | 104597635 A | 5/2015 |

(Continued)

OTHER PUBLICATIONS

International Search Report and Written Opinion dated Aug. 8, 2019, from application No. PCT/CN2019/087436.

*Primary Examiner* — Anthony Q Edwards
*Assistant Examiner* — Rashen E Morrison
(74) *Attorney, Agent, or Firm* — Thomas|Horstemeyer, LLP (57) ABSTRACT

A mounting structure for a rear housing of a display device includes a backplane including a backplane substrate and a first engaging structure disposed on one side of the backplane substrate. The mounting structure includes a rear housing including a rear housing substrate and a second engaging structure disposed on one side of the rear housing substrate. The first engaging structure and the second engaging structure are matched and engaged, causing the backplane and the rear housing to be fixed with each other.

17 Claims, 7 Drawing Sheets

(56) References Cited

U.S. PATENT DOCUMENTS

| | | | | |
|---|---|---|---|---|
| 6,094,340 A * | 7/2000 | Min | ............... | G02F 1/133308 361/679.22 |
| 6,268,997 B1 * | 7/2001 | Hong | ............... | F16M 11/10 361/679.07 |
| 6,837,469 B2 * | 1/2005 | Wu | ............... | F16M 11/126 248/278.1 |
| 7,441,744 B2 * | 10/2008 | Chen | ............... | G11B 33/124 248/309.1 |
| 7,748,680 B2 * | 7/2010 | Choi | ............... | F16M 11/38 248/371 |
| 7,869,202 B2 * | 1/2011 | Chiang | ............... | G06F 1/1601 361/679.22 |
| 8,047,497 B2 * | 11/2011 | Tai | ............... | F16M 11/22 248/346.03 |
| 8,094,243 B2 * | 1/2012 | Yokawa | ............... | F16M 11/10 348/794 |
| 8,526,197 B2 * | 9/2013 | Takashima | ............... | H04N 5/64 361/807 |
| 9,857,022 B2 * | 1/2018 | Liu | ............... | F16M 11/38 |
| 2002/0130981 A1 * | 9/2002 | Ma | ............... | G06F 1/1601 348/843 |
| 2003/0230693 A1 * | 12/2003 | Yen | ............... | A47B 49/00 248/346.3 |
| 2005/0157457 A1 * | 7/2005 | Kim | ............... | G06F 1/1601 361/679.27 |
| 2006/0087596 A1 * | 4/2006 | Park | ............... | F16M 11/22 348/739 |
| 2007/0013275 A1 | 1/2007 | Chen | | |
| 2007/0023600 A1 * | 2/2007 | Lee | ............... | F16C 11/10 248/288.11 |
| 2008/0043411 A1 * | 2/2008 | Chih | ............... | F16M 11/2021 361/679.06 |
| 2008/0057781 A1 * | 3/2008 | Chen | ............... | H01R 13/639 439/577 |
| 2008/0237426 A1 * | 10/2008 | Walters | ............... | H04N 5/64 248/316.8 |
| 2010/0142159 A1 * | 6/2010 | Lee | ............... | G06F 1/187 361/747 |
| 2011/0038129 A1 * | 2/2011 | Hsu | ............... | G06F 3/00 361/752 |
| 2011/0134359 A1 * | 6/2011 | An | ............... | G02F 1/133308 349/61 |
| 2011/0316010 A1 * | 12/2011 | Baba | ............... | G02F 1/133603 257/88 |
| 2014/0192505 A1 * | 7/2014 | Jung | ............... | F16M 11/22 361/809 |
| 2014/0233259 A1 * | 8/2014 | Jung | ............... | G02F 1/133308 362/607 |
| 2016/0353593 A1 * | 12/2016 | Park | ............... | G06F 1/1601 |
| 2017/0292691 A1 * | 10/2017 | Coo | ............... | H05K 5/0017 |
| 2018/0063971 A1 * | 3/2018 | Han | ............... | H05K 5/0204 |
| 2019/0223303 A1 * | 7/2019 | Chang | ............... | F16M 11/22 |

FOREIGN PATENT DOCUMENTS

| | | |
|---|---|---|
| CN | 206134139 U | 4/2017 |
| CN | 206237525 U | 6/2017 |
| CN | 208538414 U | 2/2019 |
| JP | 2005-221661 A | 8/2005 |
| JP | 3118676 U | 2/2006 |
| TW | M280489 U | 11/2005 |

* cited by examiner

MOUNTING STRUCTURE FOR REAR HOUSING OF DISPLAY DEVICE AND DISPLAY DEVICE

CROSS-REFERENCE TO RELATED APPLICATIONS

The present application claims is a national phase application under 35 U.S.C. § 371 of International Patent Application No. PCT/CN2019/087436, filed on May 17, 2019, which priority of Chinese Patent Application No. 201820792037.6, filed on May 25, 2018, and entitled "MOUNTING STRUCTURE FOR REAR HOUSING OF DISPLAY DEVICE AND DISPLAY DEVICE", both of which are incorporated herein by reference in its entirety.

TECHNICAL FIELD

The disclosure relates to the field of display technologies, and in particular, to a mounting structure for a rear housing of a display device and the display device.

BACKGROUND

Display devices such as liquid crystal televisions, cellular phones, computer monitors and the like are widely used in daily lives and works. The display device generally includes a front housing, a backplane, a rear housing and other components. When the display device is assembled, the front housing is fixed on the backplane, and then the rear housing is fixed on the backplane. The mounting structure between the rear housing and the backplane directly influences the assembly and disassembly efficiency between the rear housing and the backplane.

SUMMARY

In one aspect, a mounting structure for a rear housing of a display device is provided. The mounting structure includes a backplane including a backplane substrate and a first engaging structure disposed on one side of the backplane substrate. The mounting structure includes a rear housing comprising a rear housing substrate and a second engaging structure disposed on one side of the rear housing substrate. The first engaging structure and the second engaging structure are matched and engaged, causing the backplane and the rear housing to be fixed with each other.

In some arrangements, the first engaging structure includes at least two engaging beams. The second engaging structure includes at least two engaging hooks. The at least two engaging beams are correspondingly engaged with the at least two engaging hooks, respectively.

In some arrangements, each of the at least two engaging beams includes an engaging beam body and two hollow portions. The two hollow portions are two spaced openings formed on the backplane substrate, and the engaging beam body is formed by the backplane substrate between the two hollow portions.

In some arrangements, the first engaging structure further includes at least two groups of connecting structures disposed on the backplane substrate, and the at least two engaging beams are fixed on the backplane substrate through the at least two groups of connecting structures, respectively.

In some arrangements, each of the at least two groups of connection structures includes two fixing portions that fix two ends of a corresponding engaging beam, respectively. Each of the two fixing portions is arched with respect to the backplane substrate to form a gap between each fixing portion and the backplane substrate. An end of a corresponding engaging beam fixed by the each fixing portion passes through the gap of the fixing portion and is bent, to prevent the end of the corresponding engaging beam from falling out of the gap of the fixing portion.

In some arrangements, each fixing portion includes: a first sub fixing portion arched with respect to the backplane substrate to form a first gap between the first sub fixing portion and the backplane substrate; and a second sub fixing portion arched with respect to the backplane substrate to form a second gap between the second sub fixing portion and the backplane substrate. The end of the engaging beam fixed by each fixing portion sequentially passes through the first gap and the second gap and is bent. A dimension of the first gap in a vertical direction of a first direction is larger than a dimension of the second gap in the vertical direction of the first direction, and/or an arching height of the first sub fixing portion is larger than an arching height of the second sub fixing portion. The first direction is a length extension direction of a body portion of the engaging beam except for the two bent ends.

In some arrangements, at least one side of each of the fixing portions included in the backplane is provided with a through hole, and the through hole is disposed in the backplane substrate; a dimension of the through hole in a vertical direction of a first direction is larger than or equal to a dimension of an adjacent fixing portion in the vertical direction of the first direction. The first direction is a length extension direction of a body portion of the engaging beam except for the two bent ends.

In some arrangements, one of the two fixing portions is provided on a main surface of the backplane substrate facing the rear housing substrate, and remaining one of the two fixing portions is provided on the main surface of the backplane substrate facing the rear housing substrate or on a side surface of the backplane substrate.

In some arrangements, at least two through slots are disposed on the backplane substrate and each of the through slots correspondingly is disposed below the at least two engaging beams, enabling each of the at least two engaging hooks to be inserted into a corresponding through slot and engaged with a corresponding engaging beam.

In some arrangements, each of the at least two engaging beams is a metal rod or a metal wire.

In some arrangements, a boss is provided on the backplane substrate, and the at least two engaging beams are disposed on the boss.

In some arrangements, each of the at least two engaging hooks includes a bending portion, one end of the bending portion is fixed to the rear housing substrate, and remaining end of the bending portion is a free end. The bending portion is configured to be engaged with a corresponding engaging beam.

In some arrangements, at least one reinforcing rib is provided at an outer side of the bending portion. The outer side of the bending portion is a side of the bending portion opposite to a side for engaging the engaging beam.

In some arrangements, the backplane substrate includes a first engaging area and a second engaging area located on both sides of a bisector of the backplane substrate parallel to a second direction. At least one first engaging beam group is disposed in the first engaging area. Each of the at least one first engaging beam group includes a plurality of first engaging beams, and the plurality of first engaging beams are disposed apart from each other in the second direction. At least one second engaging beam group is disposed in the second engaging area. Each of the at least one second engaging beam group includes a plurality of second engaging beams, and the plurality of second engaging beams are disposed apart from each other in the second direction. The second direction is a direction parallel to a display surface determined by the display device.

In some arrangements, a number of the first engaging beam group provided in the first engaging area is equal to a number of the second engaging beam group provided in the second engaging area. A number of the first engaging beams included in each first engaging beam group is equal to a number of the second engaging beams included in each second engaging beam group. The at least one first engaging beam group and the at least one second engaging beam group are symmetrically disposed on both sides of the bisector of the backplane substrate parallel to the second direction.

In some arrangements, each first engaging beam group includes an even number of the first engaging beams symmetrically disposed on both sides of a bisector of the backplane substrate parallel to a third direction. Each second engaging beam group includes an even number of the second engaging beams symmetrically disposed on both sides of the bisector of the backplane substrate parallel to the third direction. The third direction is a direction parallel to the display surface determined by the display device, and the second direction and the third direction are perpendicular to each other.

In some arrangements, the backplane substrate further includes a third engaging area located on one of both sides of a bisector of the backplane substrate parallel to a third direction. At least one third engaging beam group is disposed in the third engaging area, each of the at least one third engaging beam group includes a plurality of third engaging beams disposed apart from each other in the third direction. The third direction is a direction parallel to the display surface determined by the display device, and the second direction and the third direction are perpendicular to each other.

In some arrangements, each third engaging beam group includes an even number of the third engaging beams symmetrically disposed on both sides of the bisector of the backplane substrate parallel to the second direction.

In another aspect, a display device including the mounting structure for the rear housing of the display device as described above is provided.

BRIEF DESCRIPTION OF THE DRAWINGS

In order to more clearly illustrate the technical solution in the arrangements of the disclosure, the drawings that are needed in the description of the arrangements will be briefly described in the following. It is obvious that the drawings in the following description are merely some arrangements of the disclosure, and for one skilled person in the art, other drawings can be obtained according to these drawings.

DETAILED DESCRIPTION

Hereinafter, the technical solutions in the arrangements of the disclosure will be clearly and completely described with reference to the accompanying drawings in the arrangements of the disclosure, and it is apparent that the described arrangements merely are a portion of but not all of the arrangements of the disclosure. All other arrangements, which can be derived by one of ordinary skill in the art based on the arrangements disclosed herein, are within the scope of the disclosure.

In the description of the disclosure, it should be understood that orientation or position relations indicated by the terms of "center", "up", "down", "front", "back", "left", "right", "vertical", "horizontal", "top", "bottom", "inside", "outside" and the like are based on the orientation or position relations shown in the drawings, only for the purpose of facilitating and simplifying description of the present disclosure, and they do not indicate or imply that the device or element referred must have a specific orientation or be constructed and operated in a specific orientation, and thus they cannot be construed as limiting the disclosure.

In the description of the disclosure, what needs to be explained is that, unless specified and defined otherwise, the terms "mount", "join" and "connect" should be construed in a broad sense, for example, as fixedly connecting, a removable connecting or integrally connecting. For a person skilled in the art, the specific meanings of the above terms in the present disclosure can be understood in specific situations.

The terms "first", "second" and "third" are only used for description purpose and cannot be construed as indicating or implying a relative importance or implicitly indicating the number of the technical features indicated. Thus, features defined by "first", "second" or "third" may explicitly or implicitly comprise one or more such features. Unless otherwise specified, "a plurality" means two or more in the description of the disclosure.

In the display device of related art, between the rear housing and the backplane are connected by screws to achieve relative fixation between the rear housing and the backplane. However, the rear housing and the backplane are connected by screws, and the screws need to be screwed one by one when the rear housing and the backplane are assembled or disassembled, which takes a long time and reduces the assembly and disassembly efficiency between the rear housing and the backplane.

Figure 1:
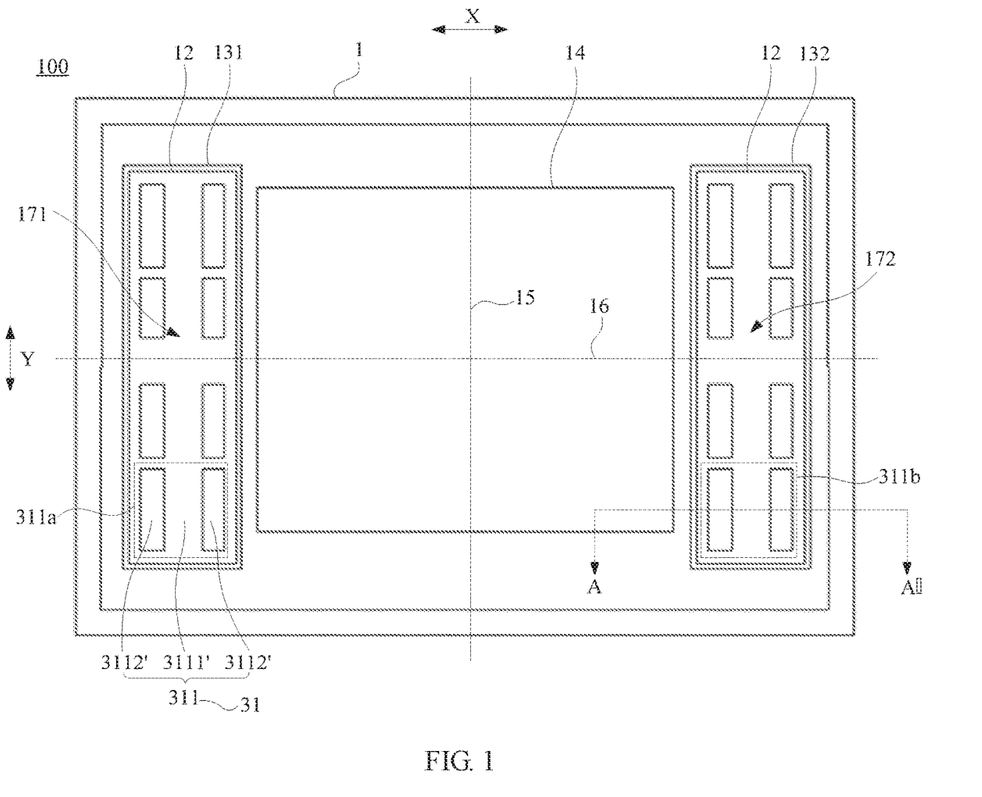
FIG. 1 is a top view of a backplane in a mounting structure according to some arrangements of the disclosure.
Figure 2:
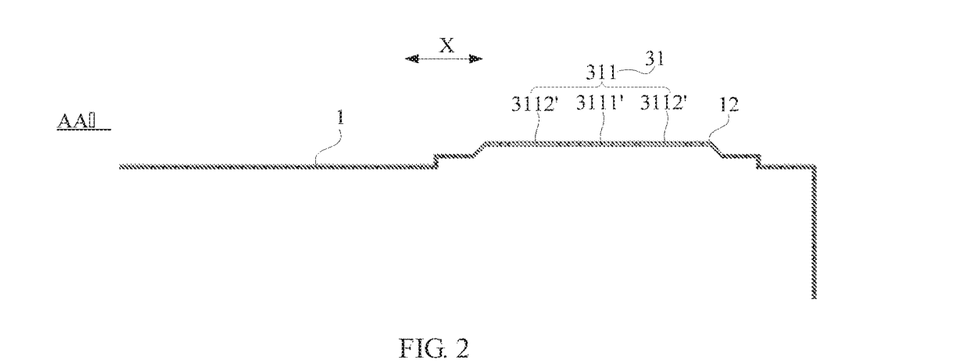
FIG. 2 is a cross-sectional view in the AA' direction of a backplane in a mounting configuration according to some arrangements of the disclosure.
Figure 3:
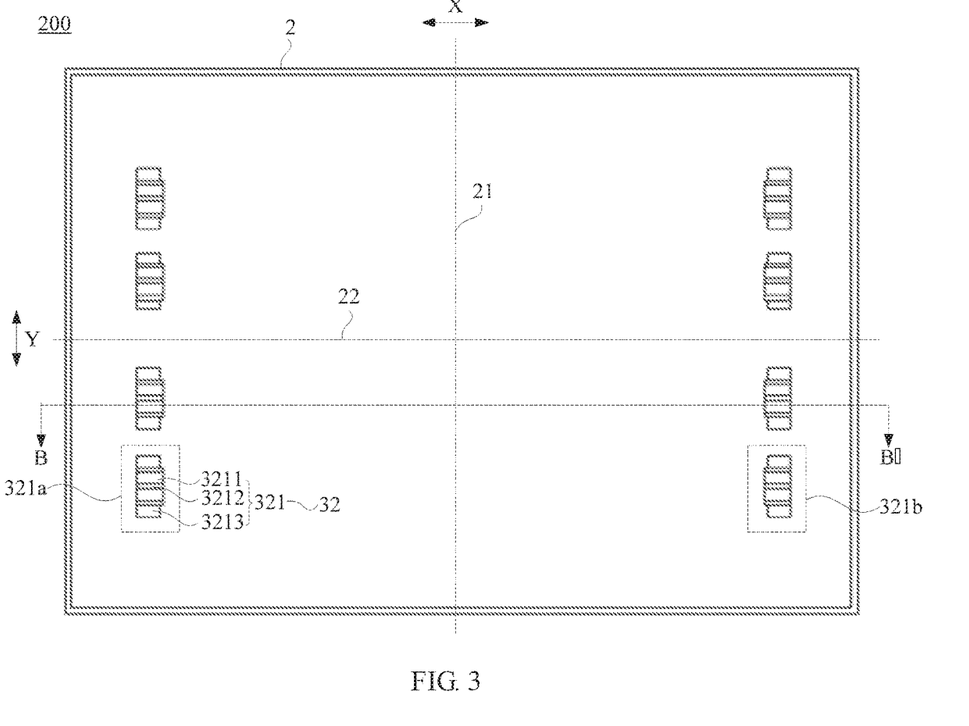
FIG. 3 is a top view of a rear housing in a mounting structure according to some arrangements of the disclosure.
Figure 4:
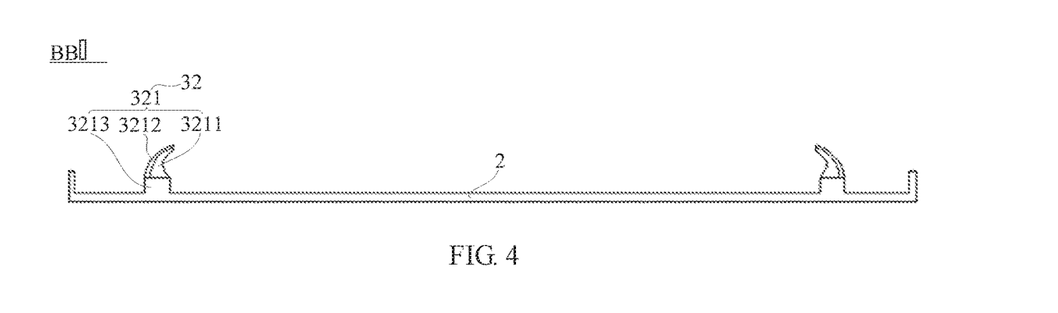
FIG. 4 is a cross-sectional view in the BB' direction of a rear housing in a mounting configuration according to some arrangements of the disclosure.

As shown in FIG. 1 to FIG. 4, some arrangements of the disclosure provide a mounting structure for a rear housing of a display device, the mounting structure including a backplane 100 and a rear housing 200. Referring to FIGS. 1 and 2, the backplane 100 includes a backplane substrate 1 and a first engaging structure 31, the first engaging structure 31 is disposed on one side of the backplane substrate 1, for example, on a side of the backplane substrate 1 facing the rear housing 200. Referring to FIGS. 3 and 4, the rear housing 200 includes a rear housing substrate 2 and a second engaging structure 32, the second engaging structure 32 is disposed on one side of the rear housing substrate 2, for example, on a side of the rear housing substrate 2 facing the backplane 100.

The first engaging structure 31 matches with the second engaging structure 32, and the two structures can be engaged with each other. By engaging the first engaging structure 31 and the second engaging structure 32 together, the backplane 100 and the rear housing 200 can be fixed relatively.

It is noted that the backplane 100 refers to the backplane 100 of the backlight module in the display device. Generally, a display device includes a display panel, a backlight module, and a rear housing 200; the backlight module is disposed on one side of the display panel opposite to the display surface of the display panel, and the backplane 100 of the backlight module is located on a side away from the display panel relative to the optical film material of the backlight module; the rear housing 200 is disposed on a side of the backlight module away from the display panel. Through the mounting structure for the rear housing of the display device, the rear housing 200 can be engaged and fixed with the backplane 100 of the backlight module, so that the firmness and the reliability of the assembled display device are improved.

In the mounting structure for the rear housing of the display device provided by above mentioned arrangements of the disclosure, the first engaging structure 31 and the second engaging structure 32 are engaged with each other, so that the rear housing 200 and the backplane 100 are relatively fixed, and when the rear housing 200 is assembled with the backplane 100, the engaging between the rear housing 200 and the backplane 100 can be achieved by directly applying a force to the backplane 100 or the rear housing 200, thus completing the assembly between the rear housing 200 and the backplane 100. This procedure is simple and quick, and does not require tightening screws, so that a large amount of time can be saved, which is beneficial to improving the assembly efficiency between the rear housing 200 and the backplane 100 of the display device.

The first engaging structure 31 and the second engaging structure 32 may have various structures. In some arrangements, referring to FIGS. 1-4, the first engaging structure 31 includes at least two engaging beams 311, and the second engaging structure 32 includes at least two engaging hooks 321, and the at least two engaging beams 311 are correspondingly engaged with the at least two engaging hooks 321, respectively, so that the rear housing 200 and the backplane 100 are relatively fixed. In this way, after the rear housing 200 and the backplane 100 are relatively fixed, the firmness and reliability between the rear housing 200 and the backplane 100 can be further improved.

The engaging beams 311 can be disposed in a variety of ways, including but not limited to the various possible designs shown below.

In some possible designs, as shown in FIGS. 1 and 2, each engaging beam 311 of the at least two engaging beams 311 includes an engaging beam body 3111' and two hollow portions 3112', the two hollow portions 3112' are two spaced openings formed on the backplane substrate 1, and the backplane substrate 1 between the two hollow portions 3112' forms the engaging beam body 3111'.

As shown in FIGS. 1-4, during the process of engaging, the engaging hook 321 corresponding to the engaging beam 311 passes through the hollow portion 3112' of the engaging beam 311, hooking the engaging beam body 3111' of the engaging beam 311, so as to realize the engaging of the engaging beam 311 and the engaging hook 321.

Through such a design, the engaging beam 311 can be integrally formed with the backplane substrate 1, that is, the backplane 100 is an integrated structure, so that the structure of the backplane 100 can be simplified.

Figure 7:
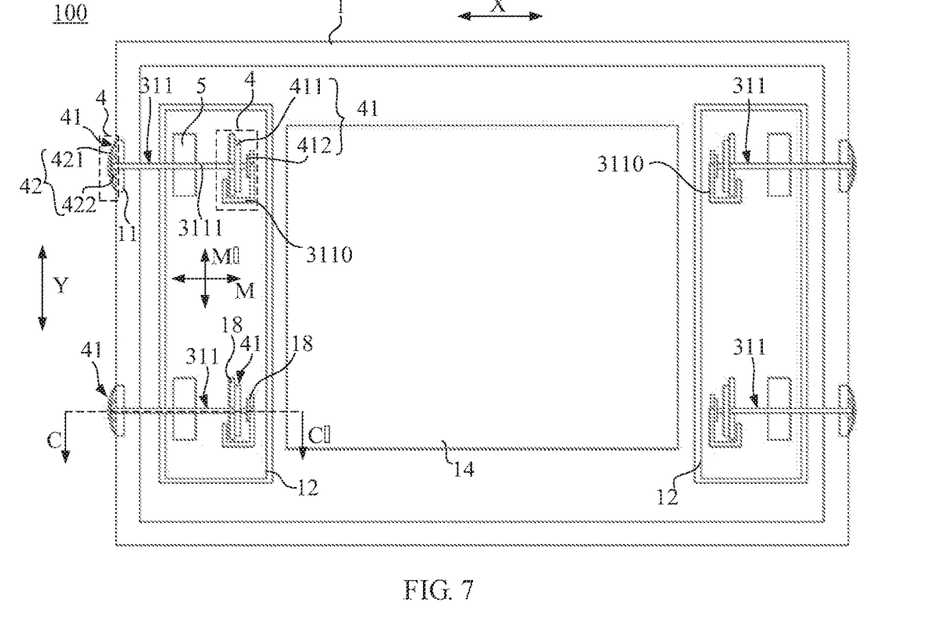
FIG. 7 is a top view of yet another backplane in a mounting structure according to some arrangements of the disclosure.

In some other possible designs, as shown in FIG. 7, the first engaging structure 31 includes at least two groups of connecting structures 4 in addition to at least two engaging beams 311. The at least two groups of connecting structures 4 are disposed on the backplane substrate 1, and the at least two engaging beams 311 are fixed on the backplane substrate 1 through the at least two groups of connecting structures 4, respectively. In this way, when the engaging beam 311 is damaged, the engaging beam 311 can be replaced by detaching the engaging beam 311 from the connecting structure 4, so that the maintenance cost can be reduced.

Exemplarily, each engaging beam 311 of the at least two engaging beams 311 is a metal rod or a metal wire (such as a steel wire or the like), and the metal rod or the metal wire can be disposed according to specific actual situations and will not be particularly defined herein.

Herein, the connection structure 4 may be disposed in a variety of ways, including but not limited to the arrangements shown below.

Figure 8:
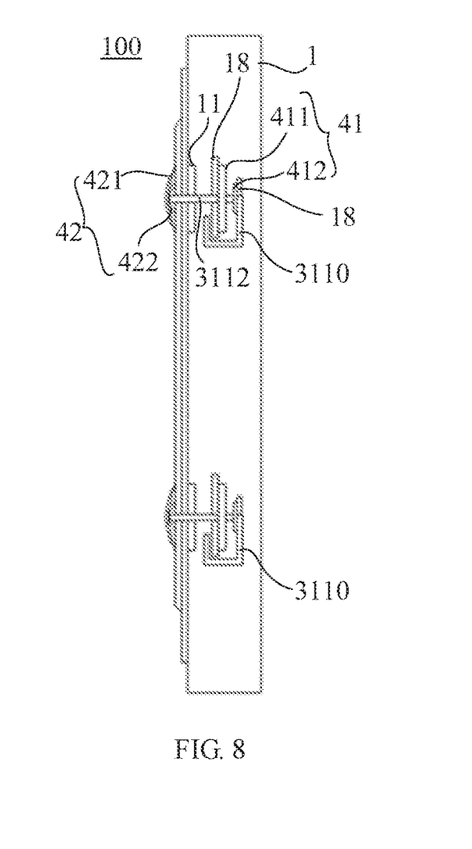
FIG. 8 is a right side view of yet another backplane in a mounting structure according to some arrangements of the disclosure.
Figure 9:
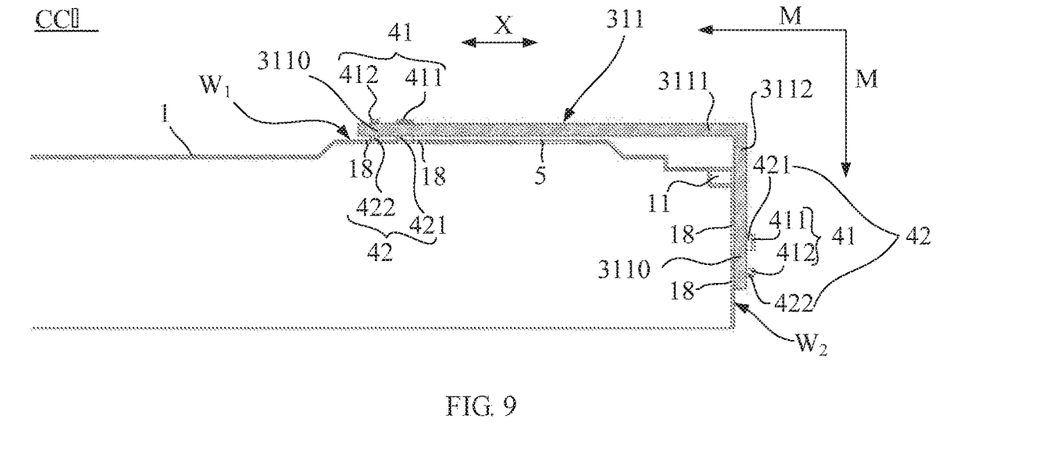
FIG. 9 is a cross-sectional view in the CC' direction of yet another backplane in a mounting configuration according to some arrangements of the disclosure.

In some arrangements, referring to FIGS. 7-9, each group of the at least two groups of connection structures 4 includes two fixing portions 41, and the two fixing portions 41 fix two ends 3110 of the corresponding engaging beams 311, respectively. Each fixing portion 41 of the two fixing portions 41 is arched with respect to the backplane substrate 1, so as to form a gap 42 between each fixing portion 41 and the backplane substrate 1. The end 3110 of the engaging beam 311 fixed by each fixing portion 41 passes through the gap 42 of the fixing portion 41 and is bent before being buckled on the fixing portion 41, so that the end 3110 of the corresponding engaging beam 311 is prevented from falling out of the gap 42 of the fixing portion 41, thus realizing the fixation of the engaging beam 311.

Exemplarily, referring to FIGS. 7-10, each of the fixing portions 41 includes: a first sub fixing portion 411 and a second sub fixing portion 412. The first sub fixing portion 411 is arched with respect to the backplane substrate 1, so as to form a first gap 421 between the first sub fixing portion 411 and the backplane substrate 1; the second sub fixing portion 412 is arched with respect to the backplane substrate 1, so as to form a second gap 422 between the second sub fixing portion 412 and the backplane substrate 1. The first sub fixing portion 411 and the second sub fixing portion 412 are disposed apart from each other in the first direction M, and one end 3110 of the engaging beam 311 fixed by the first sub fixing portion 411 and the second sub fixing portion 412 sequentially passes through the first gap 421 and the second gap 422 and is bent before being buckled on one or both of the first sub fixing portion 411 and the second sub fixing portion 412, thus realizing the fixation of the engaging beam 311.

When the one end 3110 of the engaging beam 311 is engaged with the first sub fixing portion 411 and the second sub fixing portion 412, the number of position-limit points of the engaging beam 311 in the length extending direction is relatively large, so that the deformation of the engaging beam 311 can be reduced when engaged with the engaging hook 321.

It is to be noted that, since the end 3110 of the engaging beam 311 fixed by the first sub fixing portion 411 and the second sub fixing portion 412 sequentially passes through the first gap 421 and the second gap 422, that is, when the engaging beam 311 is mounted, the end 3110 passes through the first gap 421 and then passes through the second gap 422. In other words, when the engaging beam 311 is mounted, the end 3110 passes through the first sub fixing portion 411 and then passes through the second sub fixing portion 412, thus the relative position relationship between the first sub fixing portion 411 and the second sub fixing portion 412 is as follows: the first sub fixing portion 411 is closer to the midpoint of the engaging beam 311 than the second sub fixing portion 412.

Further, as shown in FIGS. 7-10, the dimension d of the first gap 421 in the perpendicular direction M' of the first direction M is larger than the dimension $d_1$ of the second gap 422 in the perpendicular direction M' of the first direction M, and/or the arching height h of the first sub fixing portion 411 relative to the backplane substrate 1 is larger than the arching height $h_1$ of the second sub fixing portion 412 relative to the backplane substrate 1. That is, $d>d_1$; or $h>h_1$; or $d>d_1$ and $h>h_1$.

The first direction M is a length extending direction of the body portion of the engaging beam 311 except for the two bent ends 3110. Exemplarily, as shown in FIGS. 7-9, the body portion of the engaging beam 311 includes a first beam section 3111 and a second beam section 3112 connected with each other. In some possible designs, the first direction M may be a transverse direction of the display surface of the display device, and the perpendicular direction M' of the first direction M may be a longitudinal direction of the display surface of the display device.

Since the end 3110 of the engaging beam 311, when being fixed, sequentially passes through the first sub fixing portion 411 and the second sub fixing portion 412, and the dimension d of the first gap 421 is greater than the dimension $d_1$ of the second gap 422 in the perpendicular direction M' of the first direction M, and/or the arching height h of the first sub fixing portion 411 is greater than the arching height $h_1$ of the second sub fixing portion 412, the first gap 421 with a larger dimension and/or a larger arching height can limit the engaging beam 311, so as to prevent the deformation of the engaging beam from being too serious. The second gap 422 with a smaller dimension and/or a smaller arching height may facilitate to prevent the engaging beam 311 from moving in the perpendicular direction M' of the first direction M with respect to the first sub fixing portion 411.

As another arrangement, in the perpendicular direction M' of the first direction M, the dimension d of the first gap 421 may also be equal to the dimension d1 of the second gap 422, and the arching height h of the first sub fixing portion 411 may also be equal to the arching height $h_1$ of the second sub fixing portion 412, which is not limited in this arrangement of the disclosure.

In the above arrangements, the fixing portion 41 includes two sub fixing portions, i.e., the first sub fixing portion 411 and the second sub fixing portion 412. In some other arrangements, the fixing portion 41 may include only one sub fixing portion, e.g., only the first sub fixing portion 411. When the fixing portion 41 may also include only the first sub fixing portion 411, along the first direction M, the first gap 421 may be gradually increased in dimension in the perpendicular direction M' of the first direction M. That is, the first gap 421 may be flaring shaped in the first direction M. In other words, the dimension of the space 42 formed by the arching of the fixing portion 41 in the perpendicular direction M' of the first direction M is gradually increased, so that the gap 42 can not only limit the engaging beam 311 to reduce the deformation of the engaging beam 311, but also prevent the end 3110 of the engaging beam 311 from coming out of the fixing portion 41 better.

It is to be noted that the arching of fixing portion 41 with respect to the backplane substrate 1 may be formed by stamping, or the fixing portion 41 may be formed into an arched shape and then fixedly connected to the backplane substrate 1, which may be selected according to a specific actual situation, and is not particularly limited herein.

In some arrangements, referring to FIGS. 7-11, at least one side of each fixing portion 41 of the plurality of fixing portions 41 included in the backplane 100 is provided with a through hole 18, and the through hole 18 is disposed in the backplane substrate 1. The dimension of the through hole 18 in the perpendicular direction M' of the first direction M is greater than or equal to the dimension of the fixing portion 41 adjacent thereto in the perpendicular direction M' of the first direction M.

Figure 10:
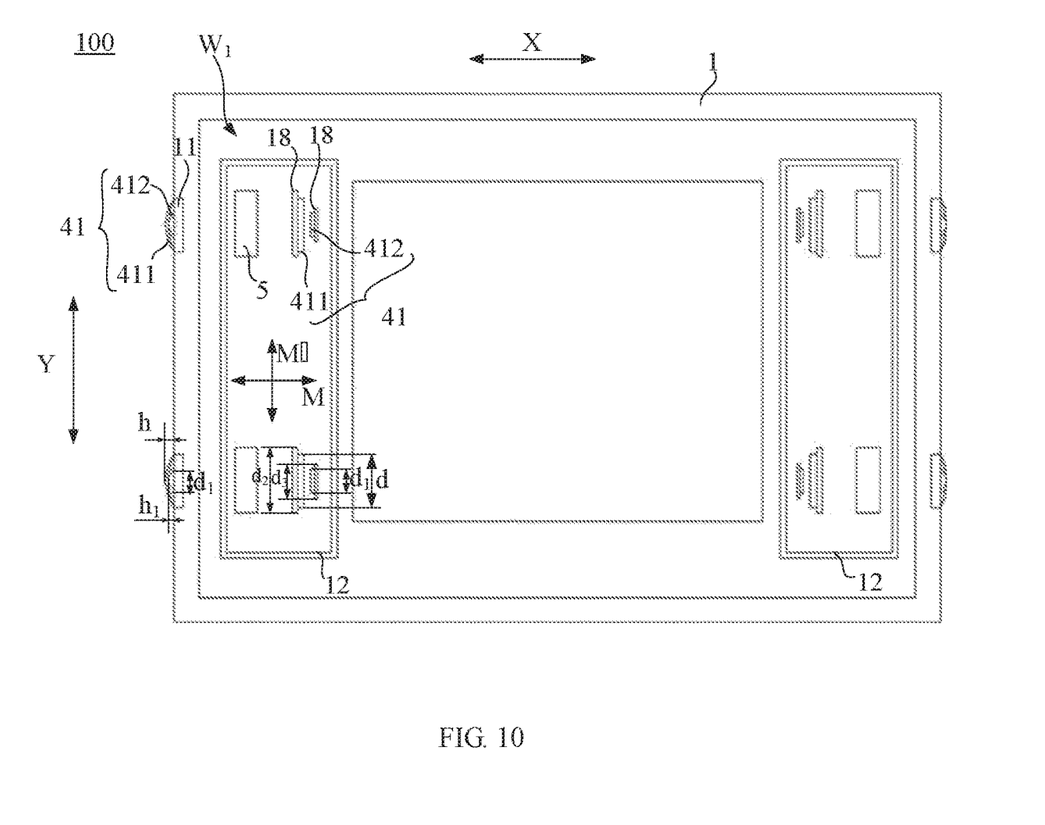
FIG. 10 is a top view of yet another backplane with an engaging beam removed in a mounting structure according to some arrangements of the disclosure.

Exemplarily, as shown in FIG. 10, each fixing portion 41 includes a first sub fixing portion 411 and a second sub fixing portion 412. One side of the first sub fixing portion 411 is provided with a through hole 18, and a dimension $d_2$ of the through hole 18 in the direction M' is greater than or equal to a dimension d of the first sub fixing portion 411 in the direction M'; one side of the second sub fixing portion 412 is also provided with a through hole 18, and the dimension $d_3$ of the through hole 18 is greater than or equal to the dimension $d_1$ of the second sub fixing portion 412 in the direction M'. In this way, when the arching of the first sub fixing portion 411 and the second sub fixing portion 412 with respect to the backplane substrate 1 is formed by stamping, the through holes 18 provided on the respective sides thereof can reduce deformation of the surrounding area of the stamping area during stamping.

Also, as shown in FIG. 9, the through hole 18 can reduce the contact area between the engaging beam 311 and the backplane substrate 1, so that the friction between the engaging beam 311 and the backplane substrate 1 can be reduced when the engaging beam 311 is deformed.

It is to be noted that the dimension of the fixing portion 41 in the perpendicular direction M' of the first direction M is the distance between two connection portions of the fixing portion 41 and the backplane substrate 1. For example, as shown in FIG. 10, the dimension d of the first sub fixing portion 411 of the fixing portion 41 in the direction M' is the distance between the connection positions of the two ends of the first sub fixing portion 411 and the backplane substrate 1; the dimension $d_1$ of the second sub fixing portion 412 of the fixing portion 41 in the direction M' is the distance between the connection positions of the two ends of the second sub fixing portion 412 and the backplane substrate 1.

The two fixing portions 41 included in each connection structure 4 for fixing each engaging beam 311 are not limited. In some arrangements, one fixing portion 41 of the two fixing portions 41 is disposed on the main surface $W_1$ of the backplane substrate 1 facing the rear housing substrate 2, and the other fixing portion 41 of the two fixing portions 41 is disposed on the main surface $W_1$ of the backplane substrate 1 facing the rear housing substrate 2 or on the side surface $W_2$ of the backplane substrate 1.

Figure 11:
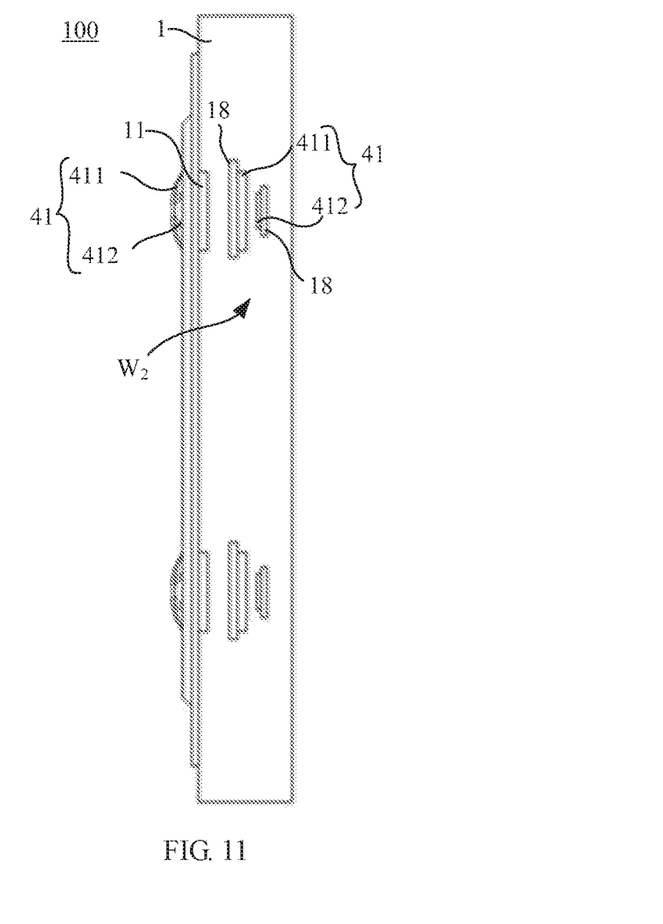
FIG. 11 is a right side view of yet another backplane with an engaging beam removed in a mounting structure according to some arrangements of the disclosure.
Figure 12:
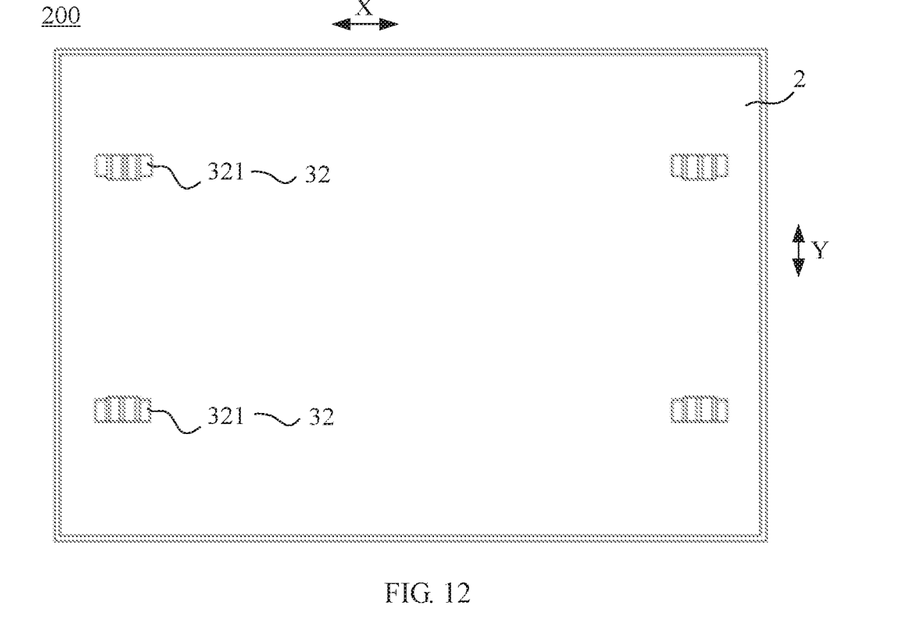
FIG. 12 is a top view of yet another rear housing in a mounting structure according to some arrangements of the disclosure.

In some possible applications, as shown in FIGS. 9-11, one fixing portion 41 of the two fixing portions 41 is disposed on the main surface $W_1$ of the backplane substrate 1 facing the rear housing substrate 2, and the other fixing portion 41 of the two fixing portions 41 is disposed on the side surface $W_2$ of the backplane substrate 1. Based on this, as shown in FIG. 9, the body portion of the engaging beam 311 except for the two ends 3110 is bent into two portions: first beam section 3111 and second beam section 3112; one end 3110 connected to the first beam section 3111 is inserted through the gap 42 of one of the fixing portions 41 on the main surface $W_1$, and is engaged with the fixing portion 41; the other end 3110 connected to the second beam section 3112 passes through the gap 42 of one of the fixing portions 41 on the side surface $W_2$ and is engaged with the fixing portion 41. Thus, the engaging beam 311 can be mounted more simply and quickly without tightening screws.

Based on this, as shown in FIGS. 9-11, a notch 11 is provided at a corner where the side surface $W_2$ of the backplane substrate 1 is connected with the main surface $W_1$ of the backplane substrate 1 facing the rear housing substrate 2, so that the engaging beam 311 is separated from the backplane substrate 1 at that corner, and thus, the engaging beam 311 can be prevented from friction against the backplane substrate 1 when the engaging beam 311 is deformed (for example, vibration of the display device during transportation) under an external force, and the abrasion of the backplane substrate 1 and the engaging beam 311 caused by the friction is reduced, and the adverse effect of the abrasion on the strength of the engaging beam 311 and the backplane substrate 1 is also reduced. In addition, the arrangement of the notch 11 can also prevent the chips generated by the friction between the engaging beam 311 and the corner of the backplane substrate 1 from affecting the normal operation of the display device.

In other possible applications, both fixing portions 41 may also be provided on the main surface $W_1$ of the backplane substrate 1 facing the rear housing substrate 2. At this time, the body portion of the engaging beam 311 except the two ends 3110 is not bent, and is located on the main surface $W_1$ of the backplane substrate 1 facing the rear housing substrate 2.

The above two implementations of the arrangement position of the fixing portion 41 may be set according to the actual situation will not be particularly limited herein.

Further, as shown in FIGS. 7 and 8, the first sub fixing portion 411 and the second sub fixing portion 412 of each fixing portion 41 may be fixing strips. The shape formed by the arching of the first sub fixing portion 411 and the second sub fixing portion 412 is not limited, and may be curved (for example, as shown in FIGS. 7 and 8, the shape formed by the arching of the first sub fixing portion 411 and the second sub fixing portion 412 are both curved), triangular or the like and will not be particularly limited herein.

In some arrangements, referring to FIGS. 7, 9 and 10, at least two through slots 5 are disposed in the backplane substrate 1 and are correspondingly disposed under the at least two engaging beams 311, respectively, so that each engaging hook 321 of the at least two engaging hooks 321 is inserted into the corresponding through slot 5, to be engaged with the corresponding engaging beam 311. Through such a design, the engaging hook 321 can be conveniently engaged with the engaging beam 311.

Exemplarily, the at least two through slots 5 are openings formed in the area of the backplane substrate 1 opposite to the engaging beam 311, and when the engaging hooks 321 is engaged with the engaging beam 311, the openings can accommodate the insertion of the engaging hooks 321, so that the engaging hooks 321 is engaged with the engaging beam 311, thus realizing the relative fixation of the rear housing 200 and the backplane 100.

Above is an example description of the connection structure 4, and the arrangement of the disclosure does not limit the specific implementation structure of the connection structure 4. As some possible designs, the connection structure 4 may also include a threaded hole disposed at the at least one end of the engaging beam 311 and a fixing table disposed on the backplane substrate 1, such that at least one end of the engaging beam 311 is connected with the fixing table by a screw.

The engaging hooks 321 may be disposed in a variety of ways, including but not limited to the possible designs shown below.

In some arrangements, referring to FIGS. 3 and 4, each engaging hook 321 of the at least two engaging hooks 321 includes a bending portion 3211, one end of which is fixed to the rear housing substrate 2, and the other end is a free end. The bending portions 3211 are configured to be engaged with the corresponding engaging beams 311.

In some possible designs, referring to FIGS. 3 and 4, the outer side of the bending portion 3211 is provided with at least one reinforcing rib 3212. The outer side of the bending portion 3211 is the side of the bending portion 3211 opposite to the side for engaging the hooking beam 311. In this way, the strength of the bending portion 3211 of the engaging hook 321 can be improved, and when the bending portion 3211 is engaged with the engaging beam 311, the bending portion 3211 can be firmly buckled on the engaging beam 311; when subjected to an external force, for example, when the display device is subjected to vibration during transportation, the bending portion 3211 is not easily disengaged from the engaging beam 311, so that the engaging stability between the engaging hook 321 and the engaging beam 311 can be ensured, and looseness between the rear housing 200 of the display device and the backplane 100 can be further avoided.

In some possible designs, referring to FIGS. 3 and 4, each engaging hook 321 may further include a base 3213 in addition to the bending portion 3211 and the reinforcing rib 3212, the bending portion 3211 may be fixed on the base 3213, that is, the bending portion 3211 is fixed to the rear housing substrate 2 through the base 3213, so that the mounting stability of the engaging hook 321 on the rear housing substrate 2 may be improved.

The arrangement of the engaging beam 311 on the backplane substrate 1 and the arrangement of the engaging hook 321 on the rear housing substrate 2 include, but are not limited to, various ways shown below.

In some arrangements, referring to FIG. 1, the backplane substrate 1 includes a first engaging area 131 and a second engaging area 132, which are located on both sides of the bisector 15 of the backplane substrate 1 parallel to the second direction Y, respectively. The second direction Y is a direction parallel to the display surface determined by the display device.

At least one first engaging beam group 171 is disposed in the first engaging area 131, and each first engaging beam group 171 of the at least one first engaging beam group includes a plurality of first engaging beams 311*a*, and the plurality of first engaging beams 311*a* are disposed apart from each other in the second direction Y.

At least one second engaging beam group 172 is disposed in the second engaging area 132, and each second engaging beam group 172 of the at least one second engaging beam group 172 includes a plurality of second engaging beams 311*b*, and the plurality of second engaging beams 311*b* are disposed apart from each other in the second direction Y.

Accordingly, referring to FIG. 3, a plurality of first engaging hooks 321*a* corresponding to the plurality of first engaging beams 311*a* one by one and a plurality of second engaging hooks 321*b* corresponding to the plurality of second engaging beams 311*b* one by one are disposed on the rear housing substrate 2. The plurality of first engaging hooks 321*a* are disposed apart from each other in the second direction Y, and the plurality of second engaging hooks 321*b* are disposed apart from each other in the second direction Y, each first engaging hook 321*a* can be engaged with a corresponding first engaging beam 311*a*, and each second engaging hook 321*b* can be engaged with a corresponding second engaging beam 311*b*.

In this way, when the rear housing 200 is engaged with the backplane 100, the backplane 100 and the rear housing 200 are uniformly stressed on both sides of the bisector 15 parallel to the second direction Y, and the number of engaging positions of the backplane 100 and the rear housing 200 in the second direction Y is large, so that the engaging between the rear housing 200 and the backplane 100 can be firmer.

Further, referring to FIG. 1, the number of the first engaging beam groups 171 disposed in the first engaging area 131 is equal to the number of the second engaging beam groups 172 disposed in the second engaging area 132. The number of engaging beams 311*a* included in each of the first engaging beam group 171 is equal to the number of second engaging beams 311*b* included in each of the second engaging beam groups 172. The at least one first engaging beam group 171 and the at least one second engaging beam group 172 are symmetrically disposed on both sides of the bisector 15 of the backplane substrate 1, which is parallel to the second direction Y.

Exemplarily, referring to FIG. 1, a group of first engaging beam groups 171 is disposed in the first engaging area 131, and the first engaging beam group 171 includes four first engaging beams 311*a*, and the four first engaging beams 311*a* are disposed apart from each other in the second direction Y.

A group of second engaging beam groups 172 is disposed in the second engaging area 132, and the second engaging beam group 172 includes four second engaging beams 311*b* which are disposed apart from each other in the second direction Y.

Accordingly, referring to FIG. 3, four first engaging hooks 321*a* and four second engaging hooks 321*b* are disposed on the rear housing substrate 2. The four first engaging hooks 321*a* are disposed apart from each other in the second direction Y, and the four second engaging hooks 321*b* are disposed apart from each other in the second direction Y, and each first engaging hook 321*a* can be engaged with a corresponding second engaging beam 311*a*, and each second engaging hook 321*b* can be engaged with a corresponding second engaging beam 311*b*.

In this way, when the rear housing 200 is engaged with the backplane 100, the number of the engaging positions of the backplane 100 and the rear housing 200 in the second direction Y is relatively large, and the backplane 100 and the rear housing 200 can be uniformly stressed in the second direction Y, so that the rear housing 200 and the backplane 100 can be more firmly fixed.

In some arrangements, as shown in FIGS. 1 and 2, the engaging beam 311 includes a first engaging beam 311*a* and a second engaging beam 311*b*. As shown in FIGS. 3 and 4, the hook 321 includes a first hook 321*a* and a second hook 321*b*. The hook mouths of the first hook 321*a* and the second hook 321*b* are opposite to each other, that is, the first hook 321*a* and the second hook 321*b* are used to be engaged with one side of the engaging beam.

During the engaging, as shown in FIGS. 1 to 4, the first hook 321*a* passes through the hollow portion 3112' of the first engaging beam 311*a* to hook the first engaging beam 311*a*, and the second hook 321*b* passes through the hollow portion 3112' of the second engaging beam 311*b* to hook the second engaging beam 311*b*, so as to achieve relative fixation of the rear housing 200 and the backplane 100.

Further, referring to FIG. 1, each first engaging beam group 171 includes an even number of first engaging beams 311*a*, and the even number of first engaging beams 311*a* are symmetrically disposed on both sides of the bisector 16 of the backplane substrate 1 parallel to the third direction X; each second engaging beam group 172 includes an even number of second engaging beams 311*b*, and the even number of second engaging beams 311*b* are symmetrically disposed on both sides of the bisector 16 of the backplane substrate 1 parallel to the third direction X.

The third direction X is a direction parallel to the display surface determined by the display device, and the second direction Y and the third direction X are perpendicular to each other. Exemplarily, the second direction Y is the horizontal direction of the display device, and the third direction X is the vertical direction of the display device; or, the second direction Y is the vertical direction of the display device, and the third direction X is the horizontal direction of the display device. It can be understood that, the second direction Y and the third direction X are perpendicular to each other and are both parallel to the display surface determined by the display device.

Exemplarily, referring to FIG. 1, a group of first engaging beam groups 171 is disposed in the first engaging area 131. The first engaging beam group 171 includes four first engaging beams 311*a*. The four first engaging beams 311*a* in the first engaging beam group 171 are symmetrically disposed in pairs on both sides of the bisector 16 of the backing plate substrate 1 parallel to the third direction X.

A group of second engaging beam groups 172 is disposed in the second engaging area 132, and the second engaging beam group 172 includes four second engaging beams 311*b*. The four second engaging beams 311*b* in the second engaging beam group 172 are symmetrically disposed in pairs on both sides of the bisector 16 of the backplane substrate 1 parallel to the third direction X.

Correspondingly, referring to FIG. 3, the rear housing substrate 2 is provided with four first hooks 321*a* and four second hooks 321*b*. Among them, the four first hooks 321*a* are symmetrically disposed in pairs on both sides of the bisector 22 of the rear housing substrate 2 parallel to the third direction X, and the four second hooks 321*b* are symmetrically disposed in pairs on both sides of the bisector 22 of the rear housing substrate 2 parallel to the third direction X, and each of the first hooks 321*a* may be engaged with a corresponding one of the second engaging beams 311a, and each of the second hooks 321b may be engaged with a corresponding one of the second engaging beam 311b.

In this way, when the rear housing 200 is engaged with the backplane 100, the stress points are symmetrical with respect to the backplane 100 and bisector of the rear housing 200 parallel to the third direction X, thus facilitating the backplane 100 and the rear housing 200 to be more uniformly stressed in the second direction Y. Moreover, since the eight engaging hooks 321 are engaged with the eight engaging beams 311 in a one-to-one correspondence manner, there are a relatively large number of the engaging contact positions between the rear housing 200 and the backplane 100, so that the rear housing 200 and the backplane 100 can be more firmly after being engaged.

Figure 5:
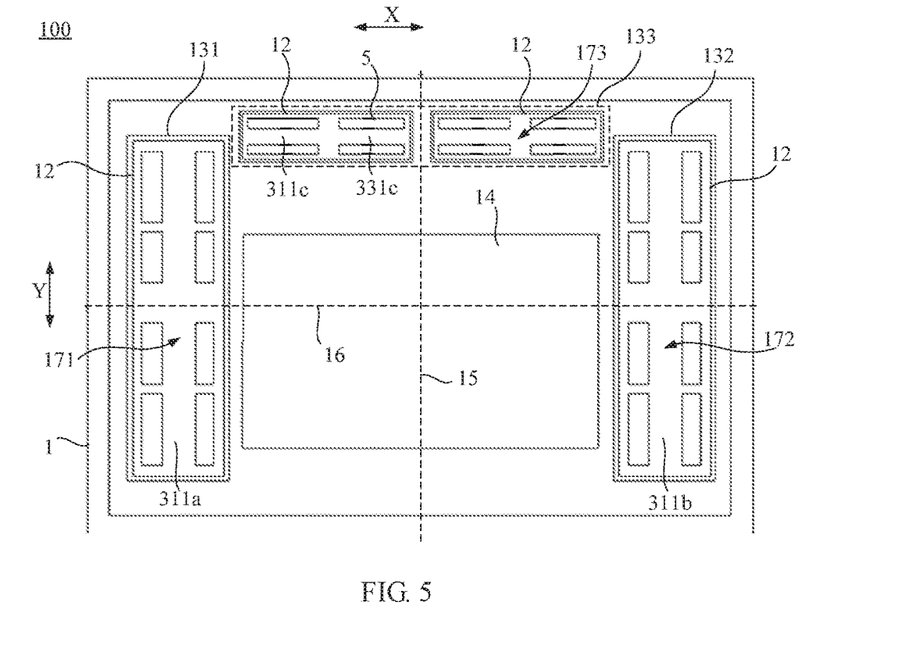
FIG. 5 is a top view of another backplane in a mounting structure according to some arrangements of the disclosure.

In some arrangements, referring to FIG. 5, the backplane substrate 1 also includes a third engaging area 133 located on one of both sides of the backplane substrate 1 parallel to the bisector 16 of the third direction X.

At least one third engaging beam group 173 is disposed in the third engaging area 133, and each third engaging beam group 173 of the at least one third engaging beam group 173 includes a plurality of third engaging beams 311c that are disposed apart from each other in the third direction X.

Figure 6:
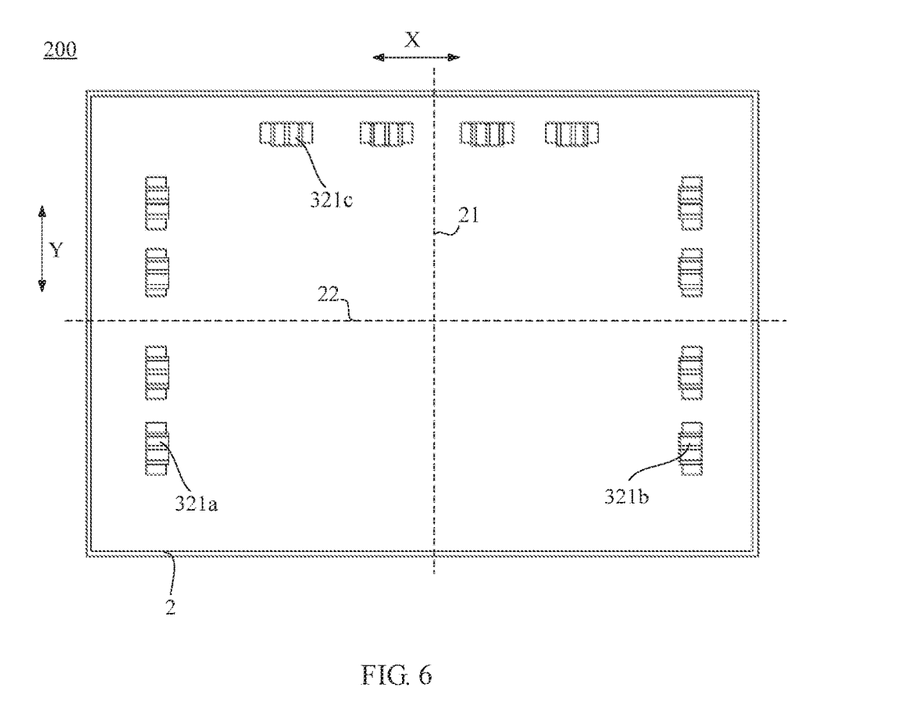
FIG. 6 is a top view of another rear housing in a mounting arrangement according to some arrangements of the disclosure.

Accordingly, referring to FIG. 6, a plurality of third engaging hooks 321c corresponding to the plurality of third engaging beams 311c one by one are provided on the rear housing substrate 2. The plurality of third engaging hooks 321c are disposed apart from each other in the third direction X, and each third engaging hook 321c may be engaged with a corresponding one of the third engaging beams 311c.

In this way, the number of the third engaging beams 311c on the side of the bisector 16 of the backplane substrate 1 parallel to the third direction X can be increased, and the number of the third engaging hooks 321c on the side of the bisector 22 of the rear housing substrate 2 parallel to the third direction X can be increased, so that the number of the engaging contact positions of the rear housing 200 and the backplane 100 can be increased, and the firmness of the rear housing 200 and the backplane 100 after being engaged are improved. Meanwhile, the plurality of third engaging beams 311c are disposed apart from each other in the third direction X, and the plurality of third hooks 321c are disposed apart from each other in the third direction X, thus ensuring the portion of the backplane substrate 1 located on the side of the bisector 16 of the backplane substrate 1 parallel to the third direction X and the portion of the backplane substrate 2 located on the side of the bisector 22 of the backplane substrate 2 parallel to the third direction X are more uniformly stressed in the third direction X.

Further, referring to FIG. 5, each third engaging beam group 173 includes an even number of third engaging beams 311c, and the even number of third engaging beams 311c are symmetrically disposed on both sides of the bisector 15 of the backplane substrate 1, which is parallel to the second direction Y.

Exemplarily, referring to FIG. 5, a group of third engaging beam groups 173 is disposed in the third engaging area 133. The third engaging beam group 173 includes four third engaging beams 311c. The four third engaging beams 311c in the third engaging beam group 173 are disposed symmetrically in pairs on both sides of the bisector 15 of the backplane substrate 1 parallel to the second direction Y.

Accordingly, referring to FIG. 6, four third engaging hooks 321c are provided on the rear housing substrate 2. The four third engaging hooks 321c are symmetrically disposed in pairs on both sides of the bisector 21 of the rear housing substrate 2 parallel to the second direction Y, and each third engaging hook 321c may be engaged with a corresponding third engaging beam 311c.

In this way, when the rear housing 200 is engaged with the backplane 100, the stress points are symmetrical with respect to the backplane 100 and the rear housing 200 parallel to the second direction Y, so that the backplane 100 and the rear housing 200 are stressed more uniformly in the third direction X, and the rear housing 200 and the backplane 100 can be engaged more firmly.

The disposed position of the third engaging beam group 173 is not limited, for example, as shown in FIG. 5, the third engaging beam group 173 may be located on one side of the bisector 16 of the backplane substrate 1 parallel to the third direction X. Correspondingly, as shown in FIG. 6, the plurality of third hooks 321c are located on one side of the rear housing substrate 2 parallel to the bisector 22 of the third direction X. Thus, the rear housing 200 and the backplane 100 can be engaged more firmly. Meanwhile, the number of the engaging beams 311 on the backplane substrate 1 and the number of the engaging hooks 321 on the rear housing substrate 2 are not too large, so that the engaging structure 3 of the rear housing substrate 2 and the backplane substrate 1 is prevented from being too complicated to affect the assembly between them. In addition, the third engaging beam group 173 is located on one side of the bisector 16 of the backplane substrate 1 parallel to the third direction X, so that the first engaging structure 31 and the second engaging structure 32 can be prevented from affecting the arrangement of other components on the backplane 100, such as circuits and electronic components, when the rear housing 200 is engaged with the backplane 100.

In addition, exemplarily, the third engaging beam groups 173 can also be distributed on both sides of the bisector 16 of the backplane substrate 1 parallel to the third direction X, that is, on both sides of the bisector 16 of the backplane substrate 1 parallel to the third direction X. At this time, correspondingly, the plurality of third engaging hooks 321c are also symmetrically distributed on both sides of the bisector 22 of the rear housing substrate 2 parallel to the third direction X.

Exemplarily, each third engaging beam 311c of the third engaging beam group 173 is integrally formed with the backplane substrate 1 (as shown in FIG. 5); or, each third engaging beam 311c of the third engaging beam group 173 is connected with the backplane substrate 1 through the connection structure 4 shown in FIG. 7.

For example, the third engaging hook 321c and the rear housing substrate 2 may be integrally formed (as shown in FIG. 6, for example), or may be designed separately. When the third engaging hooks 321c are integrally formed with the rear housing substrate 2, the number of parts on the rear housing 200 can be reduced, thus simplifying the structure for the rear housing 200 and reducing the assembly time of the rear housing 200.

In some arrangements, as shown in FIG. 5, there also may be provided with a through slot 5, for inserting the third engaging hook 321c, between each third engaging beam 311c and the backplane substrate 1. Thus, when the third engaging hook 321c is engaged with the third engaging beam 311c, the third engaging hook 321c can be easily inserted between the third engaging hook 311c and the backplane substrate 1 through the deformation of the third engaging hook 321c or the third engaging beam 311.

It is to be noted that the first engaging hook 321a, the second engaging hook 321b, and the third engaging hook 321c may all be elastic engaging hooks. When the rear housing 200 is engaged with the backplane 100, the first engaging hook 321a may be inserted into the through slot 5 through its own elastic deformation to realize engaging with the first engaging beam 311a, the second engaging hook 321b may be inserted into the through slot 5 through its own elastic deformation to realize engaging with the second engaging beam 311b, and the third engaging hook 321c may be inserted into the through slot 5 through its own elastic deformation to realize engaging with the third engaging beam 311c. In addition, the first engaging hook 321, the second engaging hook 321b and the third engaging hook 321c may also be non-elastic engaging hooks. When the rear housing 200 is engaged with the backplane 100, the first engaging hook 321, the second engaging hook 321b and the third engaging hook 321c may be inserted into the through slot 5 through elastic deformation of the rear housing 200 (e.g., the engaging beam 311) to be engaged with the corresponding first engaging beam 311a, the corresponding second engaging beam 311b and the corresponding third engaging beam 311c, respectively.

In some arrangements, referring to FIGS. 7, 9 and 10, a boss is disposed on the backplane substrate 1, and the at least two engaging beams 311 are disposed on the boss. This may improve the strength of the backplane substrate 1, and thus can reduce the deformation of the backplane substrate 1 when the engaging beam 311 is engaged with the engaging hook 321.

Exemplarily, as shown in FIG. 1, two bosses 12 are provided on the backplane substrate 1, and the two bosses 12 may be provided on both sides of the circuit board arrangement area 14 on the backplane substrate 1 in the first direction. For example, two first bosses 12 are respectively disposed at the first and second engaging areas 131 and 132, the first engaging beam group 171 is disposed on the boss 12 of the first engaging area 131, and the second engaging beam group 172 is disposed on the boss 12 of the second engaging area 132.

Exemplarily, as shown in FIG. 5, the backplane substrate 1 is provided with three bosses 12. Two bosses 12 are respectively disposed in the first and second engaging areas 131 and 132, and the third boss 12 is disposed in the third engaging area 133. The first engaging beam group 171 is disposed on the boss 12 of the first engaging area 131, the second engaging beam group 172 is disposed on the boss 12 of the second engaging area 132, and the third engaging beam group 173 is disposed on the boss 12 of the third engaging area 133. This can further improve the strength of the backplane substrate 1, so that the deformation of the backplane substrate 1 can be reduced when the first engaging beam 311a of the first engaging beam group 171 is engaged with the first engaging hook 321a, the second engaging beam 311b of the second engaging beam group 172 is engaged with the second engaging hook 321b, and the third engaging beam 311c of the third engaging beam group 173 is engaged with the third engaging hook 321c of the third engaging beam group 34. Also, in some possible designs, as shown in FIG. 5, the boss 12 may be disposed on one side of the circuit pad area 14 on the backplane substrate 1 parallel to the bisector 16 of the second direction Y. For example, the boss 12 is disposed in the third engaging area 133. This can avoid the third beam group 173 from affecting the arrangement of other components on the backplane 100, such as circuits and electronic components, when the rear housing 200 is engaged with the backplane 100.

It is to be noted that both the number of the engaging beams 311 and the number of the engaging hooks 321 may be one, and the hook mouth of the engaging hook 321 may be oriented perpendicular to the rear housing 200 and directed toward the backplane 100. During engaging, both sides of the hook mouth of the engaging hook 321 are engaged with the engaging beams 311, so as to fix the rear housing 200 to the backplane 100.

The engaging beam 311 may extend in the second direction Y or the third direction X. Specifically, it may be matched with the structure of the engaging hook 321, which is not limited herein.

In addition, the arrangement of the first and second engaging structures 31 and 32 is not limited. For example, in other arrangements, the first engaging structure 31 and the second engaging structure 32 may be as follows. The second engaging structure 32 includes an engaging protrusion disposed around a circumference edge of the backplane 100, and the first engaging structure includes an engaging groove disposed on an inner side of a side surface of the rear housing 200. The engaging groove is disposed around a circumference of the rear housing 200, and engaged with the engaging protrusion, so that the rear housing 200 and the backplane 100 are relatively fixed.

Figure 13:
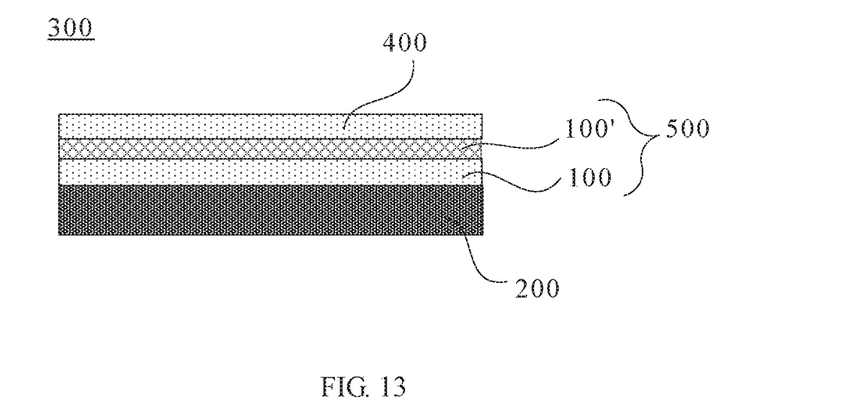
FIG. 13 is a cross-sectional view of a display device according to some arrangements of the disclosure.

Referring to FIG. 13, some arrangements of the disclosure also provide a display device 300 including: a display screen 400, a backlight module 500 and a rear housing 200. The backlight module 500 is disposed on the rear surface of the display screen 400 (i.e. the surface of the display screen 400 opposite to the display surface), and the backlight module 500 includes an optical film material 100' and a backplane 100. The backplane 100 is located on the side of the optical film material 100' away from the display screen 400. The rear housing 200 is located on the side of the backplane 100 away from the optical film material 100', and the backplane 100 and the rear housing 200 are relatively fixed by a mounting structure, and the mounting structure between the backplane 100 and the rear housing 200 is the mounting structure for the rear housing of the display device described in the above arrangements.

Because the mounting structure included in the display device provided by some arrangements of the disclosure is the same as the mounting structure for the rear housing of the display device described in the above arrangements, when the rear housing 200 is assembled with the backplane 100, the engaging between the rear housing 200 and the backplane 100 can be achieved by applying a force directly to the backplane 100 or the rear housing 200, so as to complete the assembly between the rear housing 200 and the backplane 100. This procedure is simple and quick, does not require tightening screws one by one, so that a large amount of time can be saved, which is beneficial to assembly efficiency between the rear housing 200 and the backplane 100 of the display device.

The display device 300 may be any product or component having display function such as a liquid crystal panel, electronic paper, a cellphone, a tablet computer, a television, a display, a notebook computer, a digital picture frame and a navigator.

In the description of this specification, specific features, structures, materials or characteristics may be combined in any suitable manner in any one or more of arrangements or examples.

The above described is only specific arrangements of the disclosure, however, the protection scope of the disclosure is not limited thereto, modifications or replacements that are easily conceivable for those skilled in the art within the technique range disclosed in the present disclosure should all fall into the protection scope of the present disclosure.

Thus, the protection scope of the disclosure shall be based on the protection scope of the claims.

What is claimed is:

1. A mounting structure for a rear housing of a display device, comprising:
   a backplane comprising a backplane substrate and a first engaging structure disposed on one side of the backplane substrate; and
   the rear housing comprising a rear housing substrate and a second engaging structure disposed on one side of the rear housing substrate, wherein:
      the first engaging structure and the second engaging structure are matched and engaged, causing the backplane and the rear housing to be fixed with each other;
      the first engaging structure comprises at least two engaging beams, the second engaging structure comprises at least two engaging hooks, and the at least two engaging beams are correspondingly engaged with the at least two engaging hooks, respectively;
      the backplane substrate comprises a first engaging area and a second engaging area located on both sides of a bisector of the backplane substrate parallel to a second direction;
      at least one first engaging beam group is disposed in the first engaging area, each of the at least one first engaging beam group comprises a plurality of first engaging beams, and the plurality of first engaging beams are disposed apart from each other in the second direction;
      at least one second engaging beam group is disposed in the second engaging area, each of the at least one second engaging beam group comprises a plurality of second engaging beams, and the plurality of second engaging beams are disposed apart from each other in the second direction; and
      the second direction is a direction parallel to a display surface determined by the display device.

2. The mounting structure according to claim 1, wherein:
   each of the at least two engaging beams comprises an engaging beam body and two hollow portions; and
   the two hollow portions are two spaced openings formed on the backplane substrate, and the engaging beam body is formed by the backplane substrate between the two hollow portions.

3. The mounting structure according to claim 1, wherein the first engaging structure further comprises at least two groups of connecting structures disposed on the backplane substrate, and the at least two engaging beams are fixed on the backplane substrate through the at least two groups of connecting structures, respectively.

4. The mounting structure according to claim 3, wherein:
   each of the at least two groups of connecting structures comprises two fixing portions that fix two ends of a corresponding engaging beam, respectively;
   each of the two fixing portions is arched with respect to the backplane substrate to form a gap between each fixing portion and the backplane substrate; and
   an end of a corresponding engaging beam fixed by the fixing portion passes through the gap of the fixing portion and is bent to prevent the end of the corresponding engaging beam from falling out of the gap of the fixing portion.

5. The mounting structure according to claim 4, wherein each fixing portion comprises:
   a first sub fixing portion arched with respect to the backplane substrate to form a first gap between the first sub fixing portion and the backplane substrate; and
   a second sub fixing portion arched with respect to the backplane substrate to form a second gap between the second sub fixing portion and the backplane substrate;
   wherein the end of the engaging beam fixed by each fixing portion sequentially passes through the first gap and the second gap and is bent;
   wherein a dimension of the first gap in a vertical direction of a first direction is larger than a dimension of the second gap in the vertical direction of the first direction, and/or an arching height of the first sub fixing portion is larger than an arching height of the second sub fixing portion; and
   wherein the first direction is a length extension direction of a body portion of the engaging beam except for the two bent ends.

6. The mounting structure according to claim 4, wherein at least one side of each of the fixing portions included in the backplane is provided with a through hole, and the through hole is disposed in the backplane substrate;
   wherein a dimension of the through hole in a vertical direction of a first direction is larger than or equal to a dimension of an adjacent fixing portion in the vertical direction of the first direction; and
   wherein the first direction is a length extension direction of a body portion of the engaging beam except for the two bent ends.

7. The mounting structure according to claim 4, wherein one of the two fixing portions is provided on a main surface of the backplane substrate facing the rear housing substrate, and remaining one of the two fixing portions is provided on the main surface of the backplane substrate facing the rear housing substrate or on a side surface of the backplane substrate.

8. The mounting structure according to claim 3, wherein at least two through slots are disposed on the backplane substrate and each of the through slots correspondingly is disposed below the at least two engaging beams, enabling each of the at least two engaging hooks to be inserted into a corresponding through slot and engaged with a corresponding engaging beam.

9. The mounting structure according to claim 3, wherein each of the at least two engaging beams is a metal rod or a metal wire.

10. The mounting structure according to claim 1, wherein a boss is provided on the backplane substrate, and the at least two engaging beams are disposed on the boss.

11. The mounting structure according to claim 10, wherein at least one reinforcing rib is provided at an outer side of the bending portion; and
   wherein the outer side of the bending portion is a side of the bending portion opposite to a side for engaging the engaging beam.

12. The mounting structure according to claim 1, wherein each of the at least two engaging hooks comprises a bending portion, one end of the bending portion is fixed to the rear housing substrate, and remaining end of the bending portion is a free end; the bending portion is configured to be engaged with a corresponding engaging beam.

13. The mounting structure according to claim 1, wherein the backplane substrate further comprises a third engaging area located on one of both sides of a bisector of the backplane substrate parallel to a third direction;
   at least one third engaging beam group is disposed in the third engaging area, each of the at least one third engaging beam group comprises a plurality of third engaging beams disposed apart from each other in the third direction; and the third direction is a direction parallel to the display surface determined by the display device, and the second direction and the third direction are perpendicular to each other.

14. The mounting structure according to claim 13, wherein each third engaging beam group includes an even number of the third engaging beams symmetrically disposed on both sides of the bisector of the backplane substrate parallel to the second direction.

15. The mounting structure according to claim 1, wherein a number of the first engaging beam group provided in the first engaging area is equal to a number of the second engaging beam group provided in the second engaging area; a number of the first engaging beams included in each first engaging beam group is equal to a number of the second engaging beams included in each second engaging beam group; and the at least one first engaging beam group and the at least one second engaging beam group are symmetrically disposed on both sides of the bisector of the backplane substrate parallel to the second direction.

16. The mounting structure according to claim 15, wherein each first engaging beam group comprises an even number of the first engaging beams symmetrically disposed on both sides of a bisector of the backplane substrate parallel to a third direction;

each second engaging beam group comprises an even number of the second engaging beams symmetrically disposed on both sides of the bisector of the backplane substrate parallel to the third direction; and wherein the third direction is a direction parallel to the display surface determined by the display device, and the second direction and the third direction are perpendicular to each other.

17. A display device comprising a mounting structure for a rear housing of the display device, wherein the mounting structure comprises:

a backplane comprising a backplane substrate and a first engaging structure disposed on one side of the backplane substrate; and the rear housing comprising a rear housing substrate and a second engaging structure disposed on one side of the rear housing substrate, wherein:

the first engaging structure and the second engaging structure are matched and engaged, causing the backplane and the rear housing to be fixed with each other, the first engaging structure comprises at least two engaging beams, the second engaging structure comprises at least two engaging hooks, and the at least two engaging beams are correspondingly engaged with the at least two engaging hooks, respectively;

the backplane substrate comprises a first engaging area and a second engaging area located on both sides of a bisector of the backplane substrate parallel to a second direction;

at least one first engaging beam group is disposed in the first engaging area, each of the at least one first engaging beam group comprises a plurality of first engaging beams, and the plurality of first engaging beams are disposed apart from each other in the second direction;

at least one second engaging beam group is disposed in the second engaging area, each of the at least one second engaging beam group comprises a plurality of second engaging beams, and the plurality of second engaging beams are disposed apart from each other in the second direction; and the second direction is a direction parallel to a display surface determined by the display device.

* * * * *